US011092679B2

(12) United States Patent
Baron et al.

(10) Patent No.: US 11,092,679 B2
(45) Date of Patent: Aug. 17, 2021

(54) COMPENSATION FOR LASER LIGHT SOURCE MISALIGNMENT IN A MULTIPLE LASER SCANNING TOF SENSOR SYSTEM

(71) Applicant: Microvision, Inc., Redmond, WA (US)

(72) Inventors: Henry J. Baron, Kirkland, WA (US); Phillip R. Kent, Monroe, WA (US)

(73) Assignee: Microvision, Inc., Redmond, WA (US)

( * ) Notice: Subject to any disclaimer, the term of this patent is extended or adjusted under 35 U.S.C. 154(b) by 462 days.

(21) Appl. No.: 16/031,505

(22) Filed: Jul. 10, 2018

(65) Prior Publication Data

US 2020/0018837 A1   Jan. 16, 2020

(51) Int. Cl.

| G01S 7/00 | (2006.01) |
|---|---|
| G01S 7/497 | (2006.01) |
| G01S 17/89 | (2020.01) |
| G01S 7/481 | (2006.01) |
| G01S 7/4863 | (2020.01) |
| G01S 7/4865 | (2020.01) |
| G01S 17/10 | (2020.01) |
| G01S 7/51 | (2006.01) |

(52) U.S. Cl.
CPC .......... *G01S 7/4972* (2013.01); *G01S 7/4817* (2013.01); *G01S 7/4863* (2013.01); *G01S 7/4865* (2013.01); *G01S 7/51* (2013.01); *G01S 17/10* (2013.01); *G01S 17/89* (2013.01); *B81B 2201/042* (2013.01)

(58) Field of Classification Search
USPC ....................................................... 356/5.01
See application file for complete search history.

(56) References Cited

U.S. PATENT DOCUMENTS

| 9,684,075 B2 * | 6/2017 | Xue ....................... G01S 17/42 |
| 9,804,264 B2 * | 10/2017 | Villeneuve ............ G01S 17/931 |
| 9,880,267 B2 * | 1/2018 | Viswanathan .......... G06F 3/037 |
| 10,312,275 B2 * | 6/2019 | Hynecek ................ G01J 1/0411 |
| 10,474,248 B2 * | 11/2019 | Viswanathan ........ G01S 7/4802 |
| 10,481,739 B2 * | 11/2019 | Viswanathan ......... G06F 3/0325 |
| 10,671,219 B2 * | 6/2020 | Viswanathan .......... G06F 3/017 |
| 10,830,878 B2 * | 11/2020 | McMichael ........... G01S 7/4815 |
| 2006/0253512 A1 * | 11/2006 | Nikitin ..................... G06G 7/02 |
| | | 708/400 |
| 2016/0356890 A1 * | 12/2016 | Fried ...................... G01S 17/42 |
| 2017/0068393 A1 * | 3/2017 | Viswanathan ....... H04N 9/3194 |
| 2017/0199277 A1 * | 7/2017 | Villeneuve ............. G01S 17/14 |
| 2017/0235429 A1 * | 8/2017 | Viswanathan .......... G06F 3/017 |
| | | 345/175 |
| 2018/0267152 A1 * | 9/2018 | McMichael ............. G01S 17/14 |
| 2018/0308881 A1 * | 10/2018 | Hynecek ............... H01L 31/107 |
| 2018/0348347 A1 * | 12/2018 | Xue ....................... G01S 17/003 |
| 2019/0154889 A1 * | 5/2019 | McWhirter ....... H01L 27/14643 |
| 2019/0212421 A1 * | 7/2019 | Honkanen ............ G01S 7/4816 |

(Continued)

*Primary Examiner* — James R Hulka
(74) *Attorney, Agent, or Firm* — Kevin D. Wills

(57) ABSTRACT

Laser light pulses of at least two different wavelengths are reflected off a scanning mirror. A first time-of-flight distance measurement circuit receives reflected light pulses of a first wavelength and determines distances. A second time-of-flight distance measurement circuit receives reflected light pulses of a second wavelength and determines distances. The timing of transmission of laser light pulses of differing wavelengths are adjusted, and the data buffering of converted return pulses are adjusted, to compensate for laser light source misalignment.

20 Claims, 16 Drawing Sheets

(56) References Cited

U.S. PATENT DOCUMENTS

| | | | |
|---|---|---|---|
| 2019/0212447 A1* | 7/2019 | Viswanathan | G01S 7/4815 |
| 2019/0212451 A1* | 7/2019 | Viswanathan | G01S 7/4815 |
| 2019/0250721 A1* | 8/2019 | Viswanathan | G01S 17/42 |
| 2019/0250768 A1* | 8/2019 | Viswanathan | G06F 3/0416 |

* cited by examiner

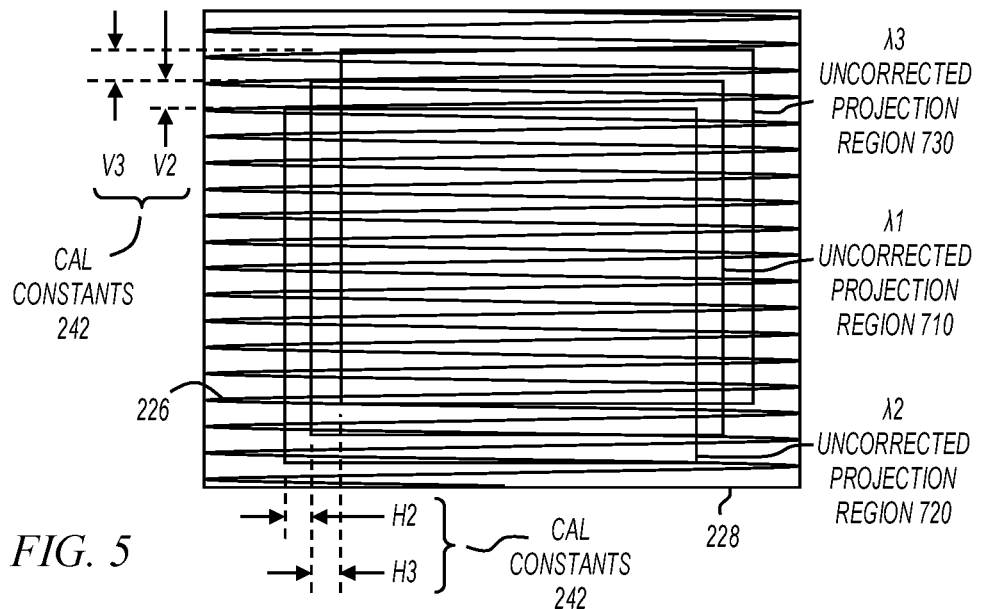
FIG. 5
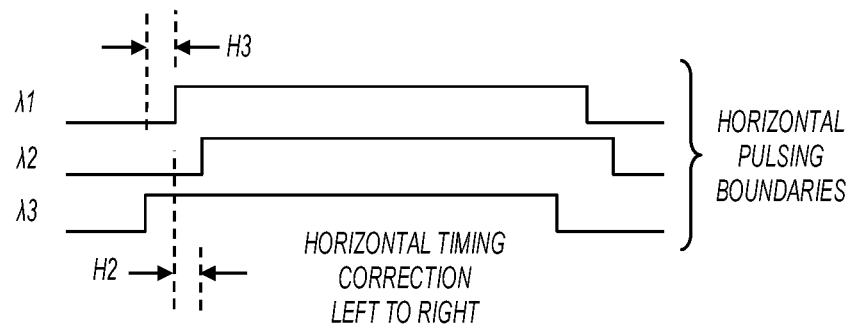
FIG. 6
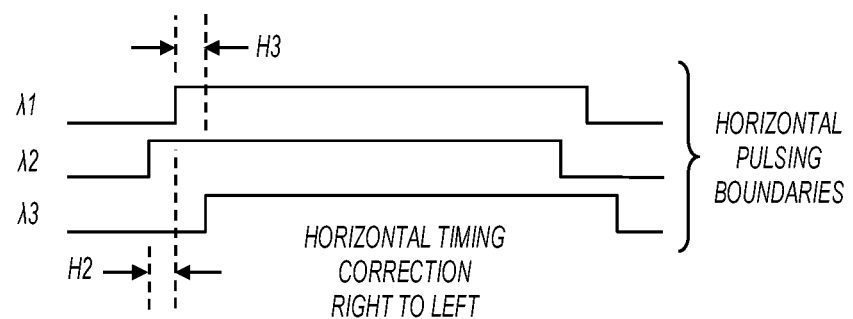

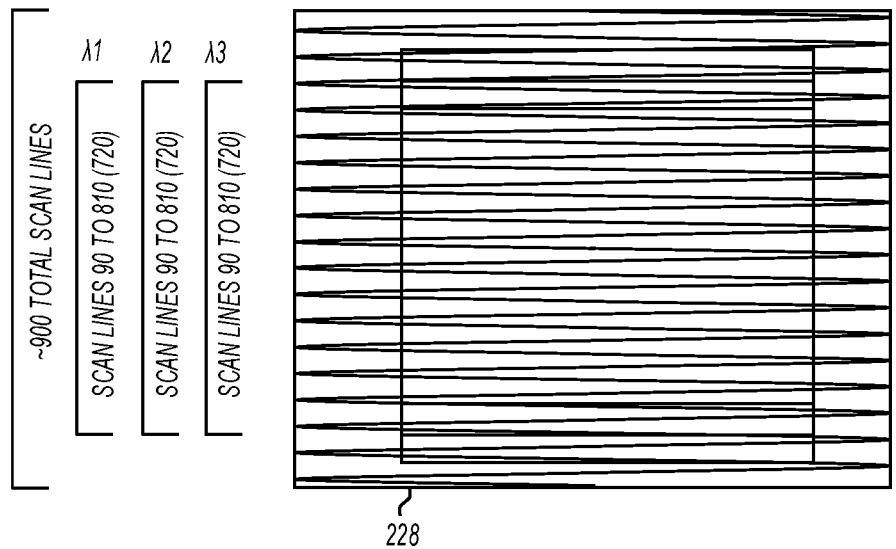
FIG. 7  HORIZONTALLY CORRECTED
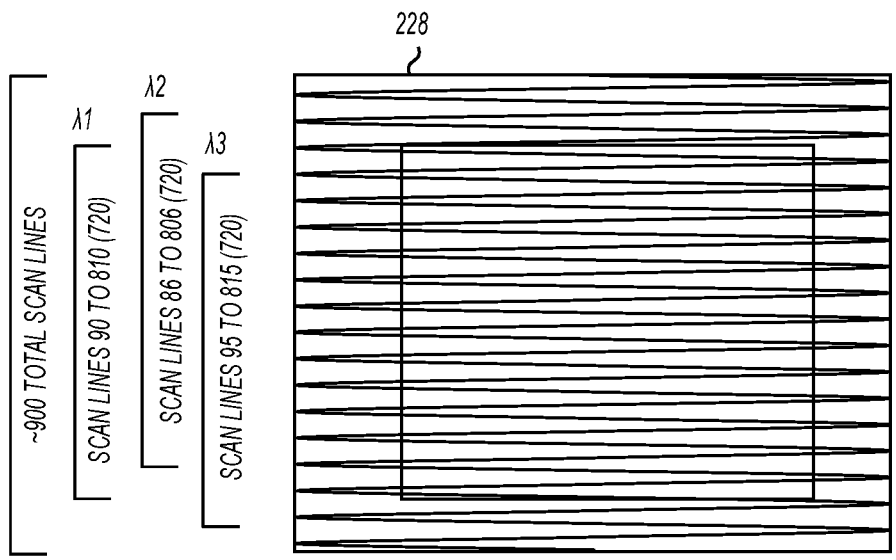
FIG. 8  HORIZONTALLY AND VERTICALLY CORRECTED

COMPENSATION FOR LASER LIGHT SOURCE MISALIGNMENT IN A MULTIPLE LASER SCANNING TOF SENSOR SYSTEM

FIELD

The present invention relates generally to distance measurement systems, and more specifically to laser based distance measurement systems.

BACKGROUND

Measuring time-of-flight of laser pulses for range finding is generally known, but limitations exist. For example, measurement errors result in inaccurate distance measurements.

FIG. 1 shows operation of a prior art rangefinding apparatus. Rangefinder 110 measures the distance to target 140 by sending an outgoing laser pulse 112 and receiving a return laser pulse 114 reflected by the target. The round trip time-of-flight (TOF) of the outgoing laser pulse 112 and return laser pulse 114 is measured by rangefinder 110 to determine the distance between rangefinder 110 and target 140.

A typical rangefinding system may produce a single square, triangle, or Gaussian shaped laser pulse with a pulse width in the range of two picoseconds (ps) to 10 nanoseconds (ns) full width half maximum (FWHM). The return laser pulse arrives after a round trip transit time that is a function of the distance to the target. This round trip transit time is referred to herein as "time-of-flight", or TOF. Spacing between laser pulses is typically limited by the TOF because subsequent pulses launched before the first reflected pulse is measured can corrupt the measurement process. For some measurement applications, it may be desirable to further reduce the spacing between laser pulses in a rangefinding apparatus.

BRIEF DESCRIPTION OF THE DRAWINGS

FIG. 5 shows projection regions within a field of view in accordance with various embodiments of the present invention;

FIG. 6 shows horizontal timing correction in accordance with various embodiments of the present invention;

FIG. 7 shows horizontally corrected projection regions in a field of view in accordance with various embodiments of the present invention;

FIG. 8 shows horizontally and vertically corrected projection regions in accordance with various embodiments of the present invention;

DESCRIPTION OF EMBODIMENTS

Figure 1:
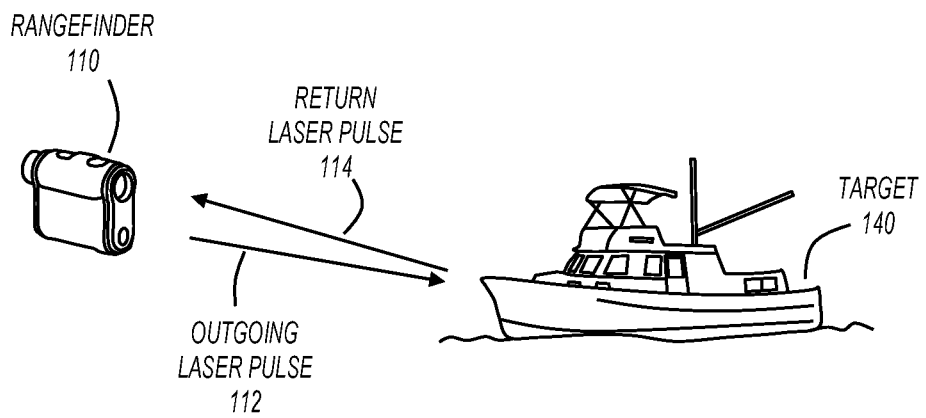
FIG. 1 shows operation of a prior art rangefinding apparatus.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
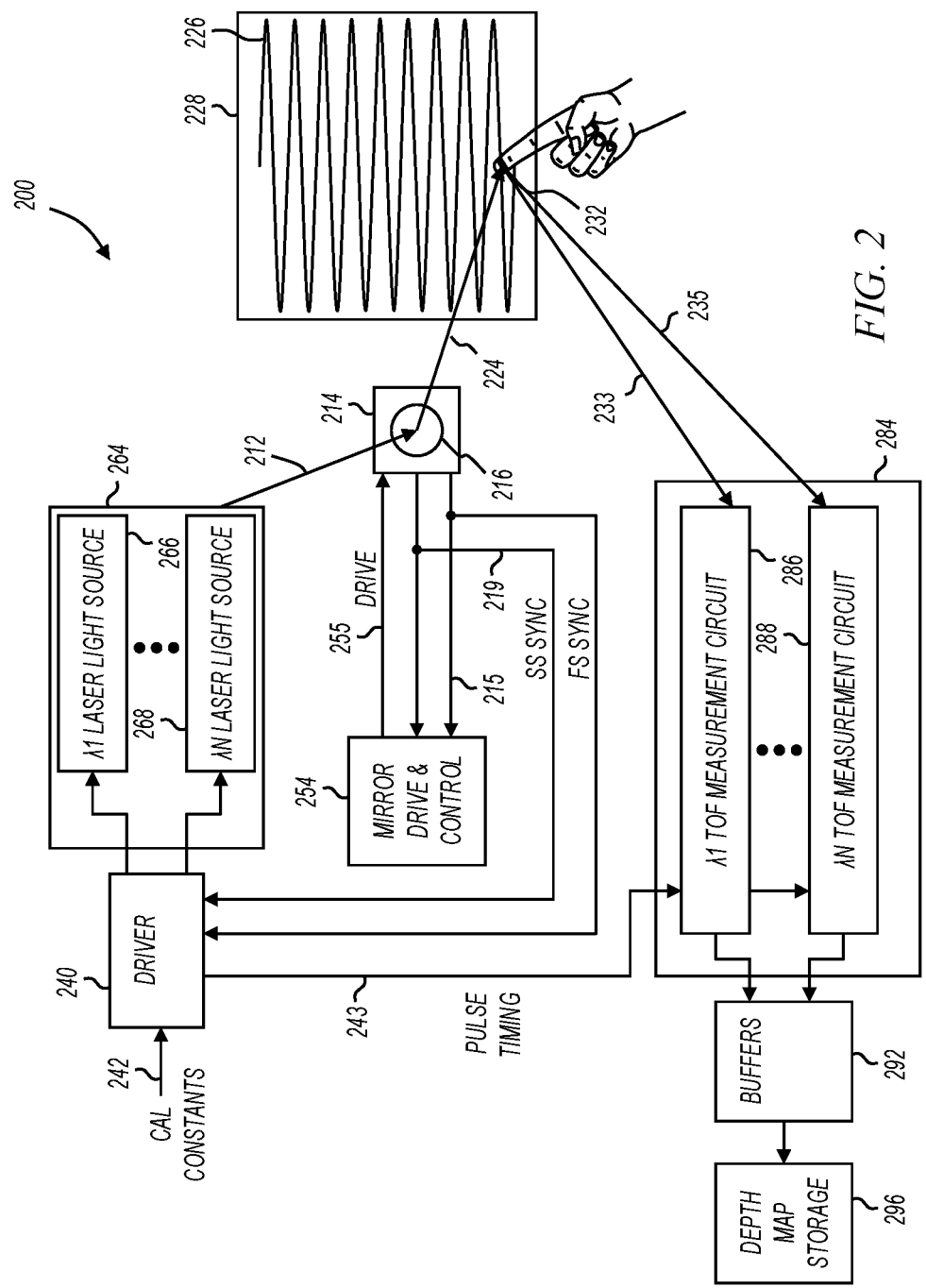
FIG. 2 shows a scanning 3D imaging system with laser light sources of at least two different wavelengths in accordance with various embodiments of the present invention.

FIG. 2 shows a scanning 3D imaging system with laser light sources of at least two different wavelengths in accordance with various embodiments of the present invention. System 200 includes driver circuit 240, laser light sources 264, scanning platform 214 with scanning mirror 216, and mirror drive and control circuit 254. System 200 also includes time-of-flight (TOF) measurement circuits 284, buffers 292, and depth map storage 296.

Light sources 264 include multiple light sources capable of emitting laser light of different wavelengths. Light sources 264 shows two light sources, however, any number of light sources at different wavelengths may be included. For example, laser light source 266 emits laser light having a wavelength λ1, and laser light source 268 emits laser light having a wavelength N, where N is any number. Light sources 264 include optics whose purpose is to combine light beam paths such that light from any of light sources 264 travels on the same or similar collimated path shown as modulated laser beam 212. The beam 212 impinges on a scanning platform 214 which is part of a microelectromechanical system (MEMS) based scanner or the like, and reflects off of scanning mirror 216 to generate a controlled output beam 224.

Current production methods typically do not achieve perfect alignment of the multiple laser light sources within the system, resulting in light from each laser light source traveling on nonidentical paths. Because of misalignment, laser light sources pulsed at identical times are directed by the mirror to two different paths in space, and reflections are returned from two different points in the field of view. Various embodiments of the present invention adjust the relative timing of transmitted light pulses and re-order the sequence of the reflected results from the multiple laser light sources, to achieve a consistent spatial map across the intended scan region. These and other embodiments are described more fully below with reference to later figures.

A scanning mirror drive and control circuit 254 provides one or more drive signal(s) 255 to control the angular motion of scanning mirror 216 to cause output beam 224 to generate a raster scan 226 in a field of view 228. In operation, light sources 264 produce light pulses at multiple different wavelengths and scanning mirror 216 reflects the light pulses as beam 224 traverses raster scan 226.

In some embodiments, raster scan 226 is formed by combining a sinusoidal component on the horizontal axis and a sawtooth component on the vertical axis. In these embodiments, controlled output beam 224 sweeps back and forth left-to-right in a sinusoidal pattern, and sweeps vertically (top-to-bottom) in a sawtooth pattern with the display blanked during flyback (bottom-to-top). FIG. 2 shows the sinusoidal pattern as the beam sweeps vertically top-to-bottom, but does not show the flyback from bottom-to-top. In other embodiments, the vertical sweep is controlled with a triangular wave such that there is no flyback. In still further embodiments, the vertical sweep is sinusoidal. The various embodiments of the present invention are not limited by the waveforms used to control the vertical and horizontal sweep or the resulting raster pattern. The vertical axis is also referred to as the slow scan axis, and the horizontal axis is also referred to as the fast-scan axis. The labels "vertical" and "horizontal" are somewhat arbitrary, since a 90 degree rotation of the apparatus will switch the horizontal and vertical axes. Accordingly, the terms "vertical" and "horizontal" are not meant to be limiting.

Although scanning mirror 216 is shown as a single mirror that scans in two dimensions, this is not a limitation of the present invention. For example, in some embodiments, mirror 216 is replaced by two mirrors, one scanning in one dimension, and a second scanning in a second dimension.

In operation, mirror drive and control circuit 254 provides drive signal(s) 255 to control the angular motion of scanning mirror 216. In some embodiments, scanning mirror 216 includes one or more sensors to detect the angular position or angular extents of the mirror deflection (in one or both dimensions). For example, in some embodiments, scanning platform 214 includes a piezoresistive sensor that delivers a voltage that is proportional to the deflection of the mirror on the fast-scan axis. Further, in some embodiments, scanning platform 214 includes an additional piezoresistive sensor that delivers a voltage that is proportional to the deflection of the mirror on the slow-scan axis. The mirror position information is provided back to mirror drive and control circuit 254 as the slow scan (SS) sync signal 219 and the fast scan (FS) sync signal 215. In these embodiments, mirror drive and control circuit 254 includes one or more feedback loops to modify the drive signals in response to the measured angular deflection of the mirror.

Mirror drive and control circuit 254 is implemented using functional circuits such as phase lock loops (PLLs), filters, adders, multipliers, registers, processors, memory, and the like. Accordingly, mirror drive and control circuit 254 may be implemented in hardware, software, or in any combination. For example, in some embodiments, control circuit 254 is implemented in an application specific integrated circuit (ASIC). Further, in some embodiments, some of the faster data path control is performed in an ASIC and overall control is software programmable. Time-of-flight (TOF) measurement circuits 286 and 288 receive IR pulse timing information 243 from driver circuit 240 and compares it to the timing of received IR pulses to measure round trip times-of-flight of an IR pulse, thereby measuring the distance (Z) to the point in the field of view 228 from which the IR pulse was reflected.

TOF measurement circuits 284 include multiple measurement circuits capable of measuring times-of-flight of light pulses of different wavelengths. TOF measurement circuits 284 shows two measurement circuits, however, any number of circuits capable of measuring TOFs of light at different wavelengths may be included. For example, TOF measurement circuit 286 measures the TOF of laser light pulses having a wavelength $\lambda 1$, and TOF measurement circuit 288 measures the TOF of laser light pulses having a wavelength $\lambda N$, where N is any number. TOF measurement circuits may be implemented with any suitable circuit elements. For example, in some embodiments, TOF measurement circuits 286 and 288 include digital and/or analog timers, integrators, correlators, comparators, registers, adders, or the like to compare the timing of the reflected laser light pulses with the pulse timing information received from driver circuit 240. Example embodiments of TOF measurement circuits are described below with reference to later figures.

In some embodiments, light sources 264 source nonvisible light such as infrared (IR) light. In these embodiments, TOF measurement circuits 286 and 288 are able to detect respective wavelengths of nonvisible light. For example, in some embodiments, light source 266 may include a laser diode that produces infrared light with a wavelength of substantially 850 nanometers (nm), and TOF measurement circuit 286 receives and measures the TOF of light pulses with a wavelength of substantially 850 nm. Also for example, in some embodiments, light source 268 may include a laser diode that produces infrared light with a wavelength of substantially 900 nanometers (nm), and TOF measurement circuit 288 receives and measures the TOF of light pulses with a wavelength of substantially 900 nm. The wavelength of light is not a limitation of the present invention. Any wavelength, visible or nonvisible, may be used without departing from the scope of the present invention.

As shown in FIG. 2, the number of wavelengths detected by the TOF measurement circuits, N, matches the number of wavelengths sourced by the laser light sources. Any number of light sources, and any number of TOF measurement circuits may be included without departing from the scope of the present invention.

The rate at which pulses are created, reflected, and processed in the TOF measurement circuits may determine the horizontal spatial measurement resolution on raster pattern 226. For example, if pulses are created far apart in time, then measured points on raster pattern 226 may be further apart, and the horizontal spatial resolution will decrease. Also for example, if pulses are created closer in time, then the horizontal spatial resolution can increase. In some embodiments, spatial interleaving of pulses of different wavelengths allows for closer pulse spacing and higher resolution on the horizontal axis.

Buffers 292 receive TOF measurement information from TOF measurement circuits 284. In some embodiments, buffers 292 include enough storage capacity to store an entire frame or multiple frames of measurement data. In other embodiments, buffers 292 include enough storage capacity to store less than an entire frame of measurement data. For example, as described further below, in some embodiments, buffers 292 includes one buffer for each TOF measurement circuit, and the size of the buffers is related to a spatial offset of projection regions caused by misalignment of the laser light sources.

Depth map storage 296 receives TOF information corresponding to distance (Z) information from buffers 292. In some embodiments, the TOF measurements held in buffers 292 are inserted in depth map storage 296 in an array format such that the location within depth map storage indicates the location within the field of from which the measurement was taken. In other embodiments, the TOF measurements held in buffers 292 include (X,Y) position information as well as TOF measurement information to yield (X,Y,Z) as a three dimensional (3D) data set that represents a depth map of the measured portion of the field of view 228. The depth map data may then be used for any suitable purpose. Examples include 3D imaging, gesture recognition, and the like.

Depth map storage 296 may be implemented using any suitable circuit structure. For example, in some embodiments, depth map storage 296 is implemented in a dual port memory device that can be written on one port and read on a second port. In other embodiments, depth map storage 296 is implemented as data structures in a general purpose memory device. In still further embodiments, depth map storage 296 is implemented in an application specific integrated circuit (ASIC).

Driver circuit 240 controls the generation of laser light pulses and causes them to be generated at times that spatially place the pulses in a desired pattern within the field of view. For example, driver circuit 240 may control the timing of laser light pulses such that laser light pulses of different wavelengths are directed to similar or identical locations within the field of view. Also for example, driver circuit 240 may control the timing of laser light pulses such that laser light pulses of different wavelengths are interleaved in space.

Driver circuit 240 receives calibration constants 242 that describe offsets between the laser light sources. For example, the calibration constants may include horizontal and vertical offset information that describes relative offsets between the laser light sources. In some embodiments, the calibration constants are the result of measurements performed when the system is manufactured. For example, after manufacture, the relative offset of laser light pulses of different wavelengths may be measured within the field of view, and calibration constants 242 are stored as a result. Accordingly, calibration constants 242 may be different for each unit produced. Driver circuit 240 generates pulse timing signals as a function of the mirror position (SS SYNC and FF SYNC) and the calibration constants to effect the desired spatial relationship between laser light pulses of different wavelengths.

Timing signals for each laser light pulse are then provided to TOF measurement circuits 284 at 243. Driver circuit 240 may be implemented using any suitable circuit elements. For example, driver circuit 240 may be implemented using a processor and memory, a dedicated state machine, registers, adders, multipliers, and the like.

Figure 3:
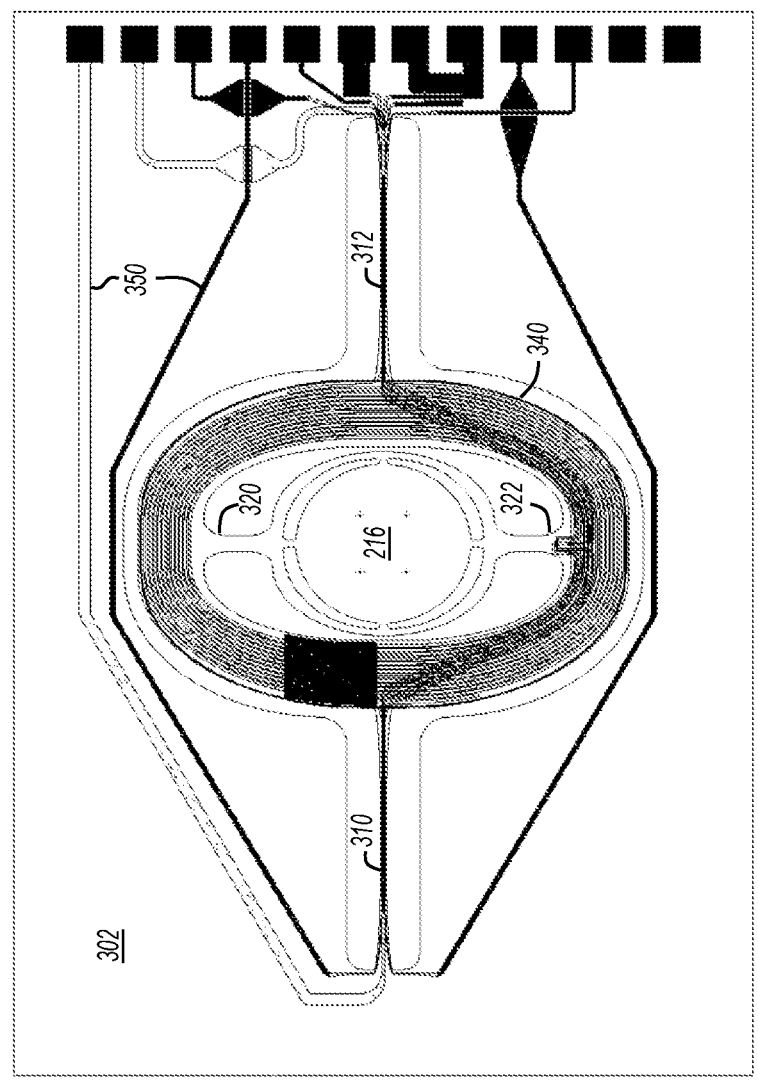
FIG. 3 shows a plan view of a microelectromechanical system (MEMS) device with a scanning mirror in accordance with various embodiments of the present invention.

FIG. 3 shows a plan view of a microelectromechanical system (MEMS) device with a scanning mirror. MEMS device 214 includes fixed platform 302, scanning platform 340, and scanning mirror 216. Scanning platform 340 is coupled to fixed platform 302 by flexures 310 and 312, and scanning mirror 216 is coupled to scanning platform 340 by flexures 320 and 322. Scanning platform 340 has a drive coil connected to drive lines 350, which are driven by a drive signal provided on node 255 from mirror and drive control circuit 254 (FIG. 2). The drive signal includes an excitation signal to excite resonant motion of scanning mirror 216 on the fast-scan axis, and also includes a slow-scan drive signal to cause non-resonant motion of scanning platform 340 on the slow-scan axis.

Figure 4:
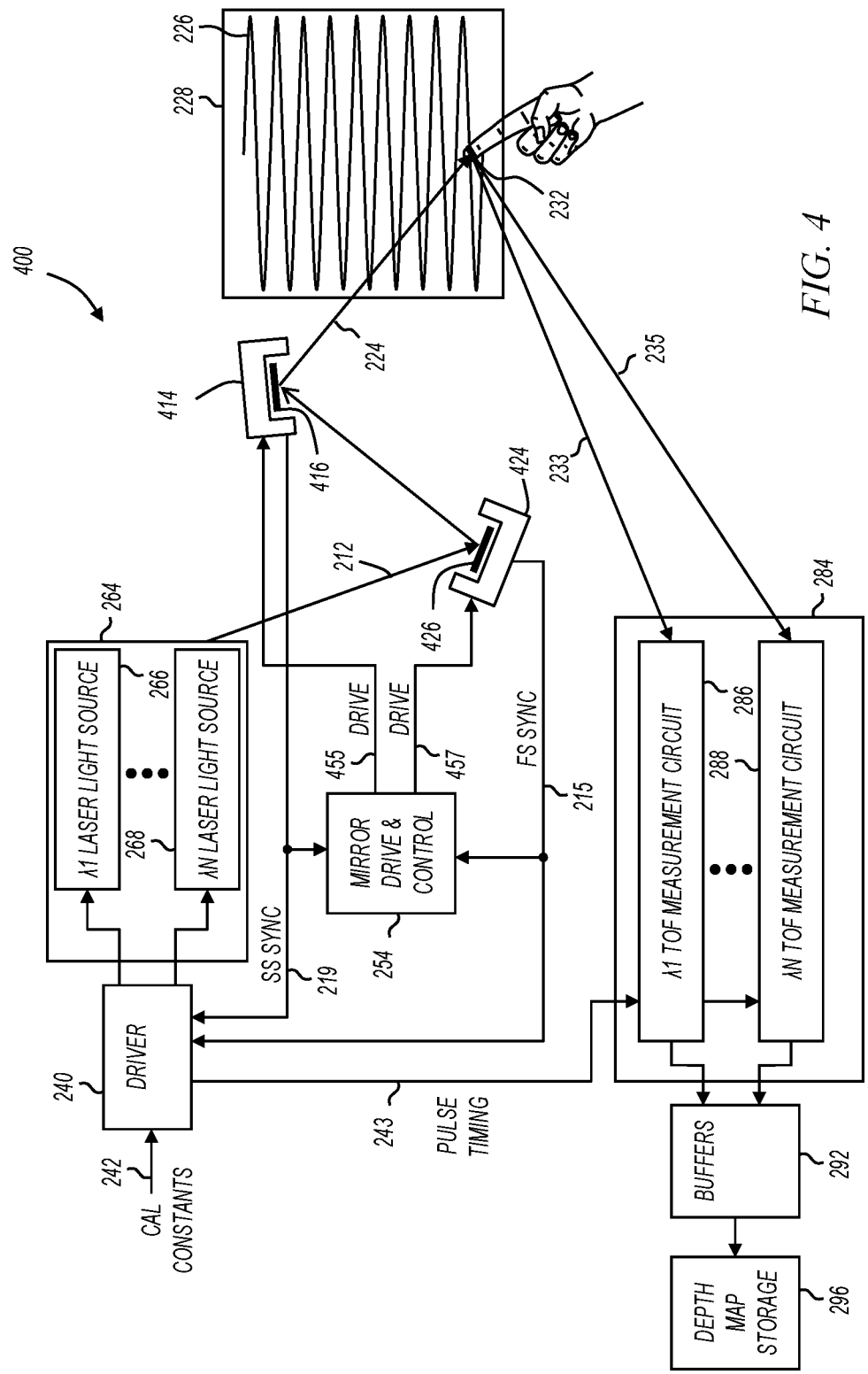
FIG. 4 shows a scanning 3D imaging system with laser light sources of at least two different wavelengths in accordance with various embodiments of the present invention.

FIG. 4 shows a scanning 3D imaging system with laser light sources of at least two different wavelengths in accordance with various embodiments of the present invention. 3D imaging system 400 is similar to 3D imaging system 200 (FIG. 2) with the exception that two scanning mirrors are present instead of one. In some embodiments, a first MEMS device 424 includes a scanning mirror 426 configured to deflect along one axis and a second MEMS device 414 includes a scanning mirror 416 configured to deflect along a second axis that is largely perpendicular to the first axis. Furthermore, in some embodiments, the first mirror is used for fast-scan motion, while the second mirror is used for slow-scan motion. In some embodiments, the fast-scan motion comprises resonant sinusoidal motion while the slow-scan motion comprises non-resonant quasi-static controlled motion.

Drive control circuit 254 provides a fast-scan drive signal to MEMS device 424 on node 457 to excite motion of mirror 426, and receives the feedback FS SYNC signal on node 215. Drive circuit 254 also provides a slow-scan drive signal to MEMS device 414 on node 455 to excite motion of mirror 416 and receives the feedback SS SYNC signal on node 219.

Although 3D imaging system 200 (FIG. 2) and 3D imaging system 400 (FIG. 4) are described having MEMS devices to perform scanning of laser light pulses, this is not a limitation of the present invention. Any device or method for scanning light pulses along a scan path may be employed without departing from the scope of the present invention.

FIG. 5 shows projection regions within a field of view in accordance with various embodiments of the present invention. Projection regions 710, 720, and 730 represent regions within field of view 228 that different laser light sources will project into when pulsed with identical timing. This is a result of laser light source misalignment. Projection regions 710, 720, and 730 are referred to as "uncorrected projection regions" because without an in-system correction method for these alignment errors, the three laser light sources will project onto three different regions during mirror scanning, and the resulting depth data will be skewed. For example, if the three laser light sources are pulsed together, a single TOF depth measurement obtained by each TOF measurement circuit at the upper left corner of the active scan will not be the same. Each laser light pulse will be reflected at different points of the mirror scan window when, ideally, they should be sampling the same point when driven with identical timings.

Calibration constants 242 describe the relative offsets between projection regions. For example, H2 is a horizontal offset between projection regions 710 and 720, H3 is a horizontal offset between projection region 710 and 730, V2 is a vertical offset between projection region 710 and 720, and V3 is a vertical offset between projection region 710 and 730. These offsets may be measured at any time during the life cycle of a 3D imaging system. For example, the offsets may be measured, and the calibration constants generated, when the 3D imaging system is manufactured.

In embodiments represented by FIG. 5, the laser light source that emits pulses having wavelength λ1 is considered the reference aligned with the MEMS mirror, while the laser light sources that emit pulses having wavelengths λ2 and λ3 are tuned relative to the laser light source that emits pulses having wavelength λ1, although this is not a limitation of the present invention. Any laser light source may be considered the reference to which the other laser light sources may be tuned. Further, in some embodiments, all laser light sources may be tuned to a fixed location or an arbitrary location within the field of view. As used herein, the term "tuned" refers to the alteration of pulse timing to effect a desired spatial relationship between projection regions.

FIG. 6 shows horizontal timing correction in accordance with various embodiments of the present invention. In the example of FIG. 6, horizontal correction is performed by applying a time shift to the output pulse timing for laser light sources that emit pulses having wavelengths λ2 and λ3. The timing shift is based upon calibration constants H2 and H3 that were recorded during production. In some embodiments, calibration constants for each 3D imaging system are stored on the system during production and retrieved and applied by the system during each use.

Because the scan path alternates between left-to-right and right-to-left, the sign (+/−) of the time shift is reversed in each direction. If a laser light source is misaligned to the right, then that laser light source is driven an appropriate number of clock cycles earlier than the calibration reference laser light source when the MEMS mirror is scanning left-to-right, so that the corresponding laser light pulses are projected at a corrected horizontal position within the field of view. Conversely, the same laser light source is pulsed later than the reference laser light source when the MEMS mirror is scanning right to left. A laser light source misaligned to the left is horizontally corrected in a similar manner with opposite sign.

FIG. 7 shows horizontally corrected projection regions in a field of view in accordance with various embodiments of the present invention. The three projection regions shown in FIG. 7 are aligned horizontally within field of view 228, but are still offset vertically.

In the example of FIG. 7, the raster scan includes approximately 900 scan lines in each vertical frame with only the centermost 720 lines being targeted to be in the active scan region. For example, without correction, each of the laser light sources may be active during scan lines 90 to 810 for a total of 720 active scan lines. More or less scan lines may be included and/or active without departing from the present invention. If three laser light sources are active on the same 720 mirror scan lines as shown in FIG. 7, the result is that laser light sources will project in three different vertically offset regions. In the example of FIG. 7, the laser light source that emits pulses having a wavelength λ2 has a downward alignment error and the laser light source that emits pulses having a wavelength of λ3 has an upward alignment error.

Various embodiments of the present invention modify which scan lines are active for one or more laser light sources, thereby reducing the vertical offset between projection regions to one half line or less. An example is shown below with reference to FIG. 8.

FIG. 8 shows horizontally and vertically corrected projection regions in accordance with various embodiments of the present invention. Various embodiments of the present invention modify the active scan lines independently for each laser light source. The light source that emits pulses having a wavelength of λ1, being the reference laser light source, is unmodified and scans and collects data points on mirror scan lines 90-810. Line 90 is therefore considered to be active line 1 of the 720 active lines for the light source that emits pulses having a wavelength of λ1. The laser light source that emits pulses having a wavelength of λ2, in this example, is offset four lines upward. The active scan region for this laser light source is shifted early by four lines, using mirror scan lines 86-806. Line 86 is therefore considered to be active line 1 of the 720 active lines for the laser light source that emits pulses having a wavelength of λ2. The laser light source that emits pulses having a wavelength of λ3, in this example, is offset five lines downward. The active scan region for this laser light source is shifted late by five lines, using mirror scan lines 95-815. Line 95 is therefore considered to be active line 1 of the 720 active lines for the laser light source that emits pulses having a wavelength of λ3. As a result of independent scan line changes for each laser light source, the three laser light sources have overlapping targeted scan regions within the total mirror scan region, accurate to within +/−one half line.

The example of FIGS. 7 and 8 shows one laser light source being the reference laser light source, and the projection regions of the remaining laser light sources being modified such that all projection regions have a defined spatial relationship. In some embodiments, projection regions for all of the laser light sources in the system are modified to locate all projection regions relative to the field of view. Any number of laser light sources may be included, and any number of projection regions may be modified based on calibration data without departing from the scope of the present invention.

Figure 9:
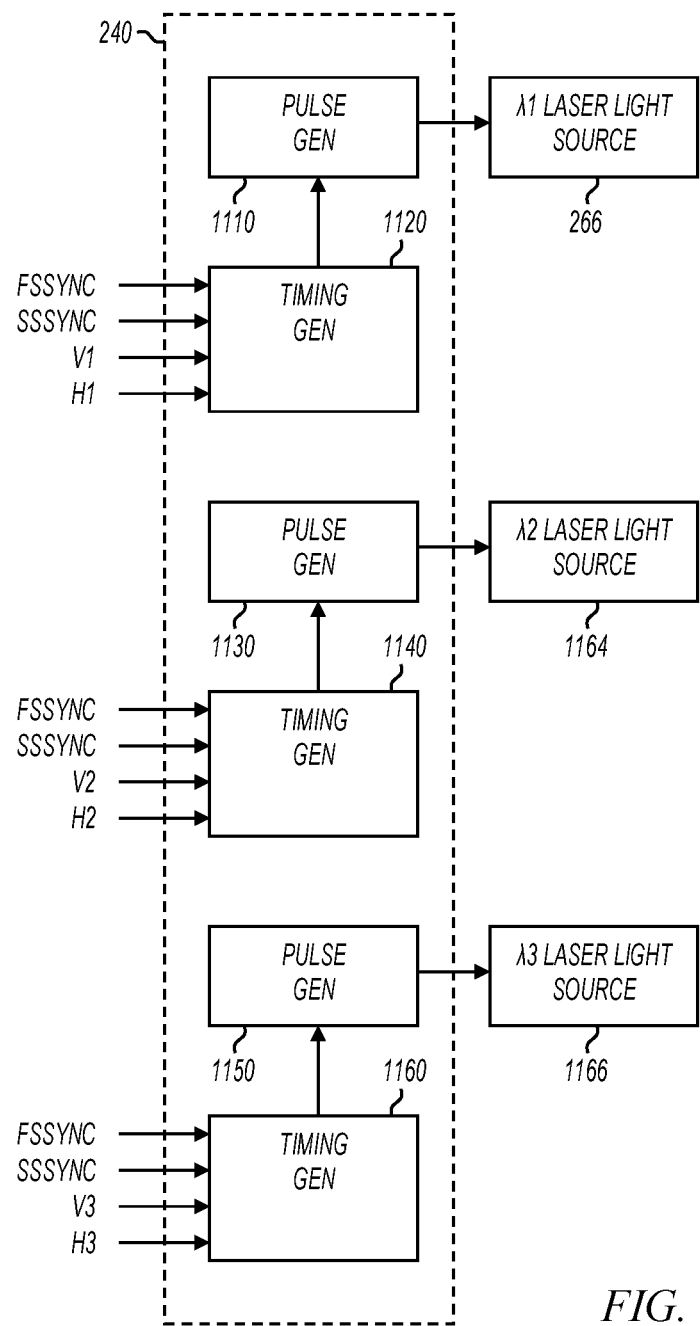
FIG. 9 shows a driver circuit and laser light sources in accordance with various embodiments of the present invention.

FIG. 9 shows a driver circuit and laser light sources in accordance with various embodiments of the present invention. Driver circuit 240 includes timing generation circuits and pulse generation circuits for each of the laser light sources. For example, driver circuit 240 includes timing generation circuit 1120 and pulse generation circuit 1110 to drive laser light source 266, timing generation circuit 1140 and pulse generation circuit 1130 to drive laser light source 1164, and timing generation circuit 1160 and pulse generation circuit 1150 to drive laser light source 1166.

Each of the timing generation circuits receives calibration constants that describe projection region offsets for the corresponding laser light source. For example, timing generation circuit 1120 receives calibration constants V1 and H1 that describe projection region offsets for laser light source 266, timing generation circuit 1140 receives calibration constants V2 and H2 that describe projection region offsets for laser light source 1164, and timing generation circuit 1160 receives calibration constants V3 and H3 that describe projection region offsets for laser light source 1166. Continuing with the examples of FIGS. 7 and 8, V1 and H1 have values of zero, because laser light source 266 is considered the reference. V2 and H2 have values that describe the offset of the projection ranging for laser light source 1164 relative to the projection region of laser light source 266, and V3 and H3 have values that describe the offset of the projection region for laser light source 1166 relative to the projection region of laser light source 266.

In operation, the timing generation circuits receive information describing the current mirror position and modify the timing of pulses generated by the corresponding laser light sources in response to the mirror position and calibration constants. The mirror position in FIG. 9 is described by the FS SYNC and SS SYNC feedback signals. Timing generation circuits 1120, 1140, and 1160 may be implemented with any suitable circuit elements. For example, in some embodiments, timing generation circuits 1120, 1140, and 1160 include analog-to-digital converters, adders, multipliers, counters, registers, delay elements, digital-to-analog converters, and the like.

Pulse generation circuits 1110, 1130, and 1150 modulate pulses that are used to drive laser light sources 266, 1164, and 1166, respectively. For example, pulse generation circuits 1110, 1130, and 1150 may control the power level, pulse shape, or any other characteristic of the pulses used to drive laser light sources 266, 1164, and 1166, respectively. Pulse generation circuits 1110, 1130, and 1150 modulate pulses in response to the timing signals received from timing generation circuits 1120, 1140, and 1160, respectively. Pulse generation circuits 1110, 1130, and 1150 may be implemented with any suitable circuit elements. For example, in some embodiments, pulse generation circuits 1110, 1130, and 1150 include digital-to-analog converters, amplifiers, filters, and the like.

Figure 10:
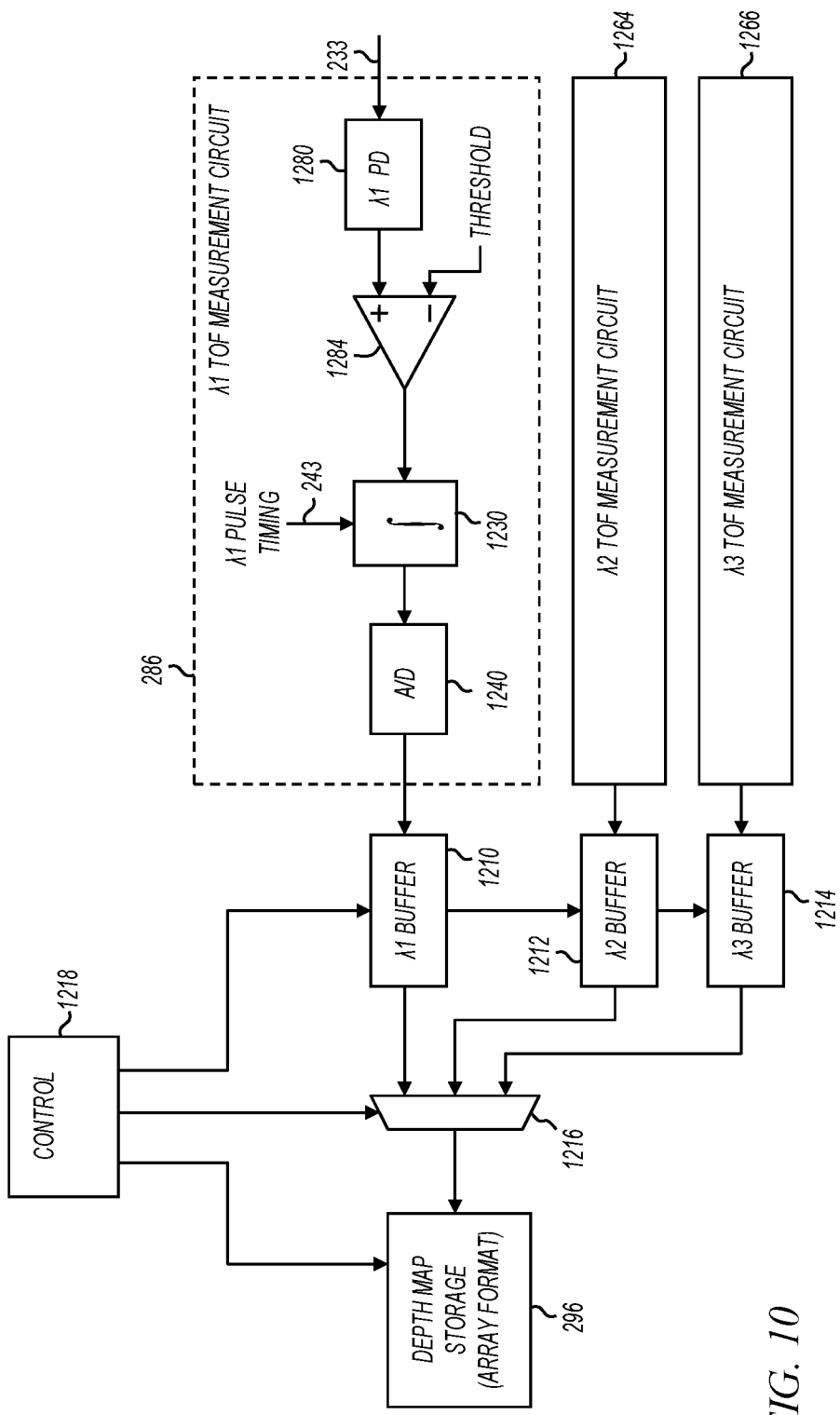
FIG. 10 shows time of flight distance measurement circuits with post processing circuits in accordance with various embodiments of the present invention.

FIG. 10 shows time of flight distance measurement circuits with post processing circuits in accordance with various embodiments of the present invention. Time-of-flight measurement circuit 286 measures the TOF of pulses having a wavelength of $\lambda 1$ and stores the results in buffer 1210. Similarly, TOF measurement circuit 1264 measures the TOF of pulses having a wavelength of $\lambda 2$ and stores the results in buffer 1212, and TOF measurement circuit 1266 measures the TOF of pulses having a wavelength of $\lambda 3$ and stores the results in buffer 1214. Buffers 1210, 1212, and 1214 are example implementations of buffers 292 (FIG. 2).

Control circuit 1218 and multiplexer 1216 form post processing circuits that combine the TOF measurements from the buffers into an array within depth map storage 296. In some embodiments, the array index (the location within depth map storage 296) corresponds to a spatial location of each TOF measurement. Buffers 1210, 1212, and 1214 may be populated out of order in time because of laser light source offsets, and the post processing re-orders the TOF measurements within depth map storage 296 to simplify later depth map processing.

In operation, control circuit 1218 may combine TOF data from buffers 1210, 1212, and 1214 after each buffer has at least one scan line worth of TOF data, or may combine the data after a complete frame of TOF data is collected. An example of operation using less than a complete frame of TOF data is described below with reference to FIGS. 11 and 12. Control circuit 1218 may include any suitable circuit elements. For example, control circuit 1218 may include a processor, a dedicated state machine, counters, adders, multipliers, or the like.

Time-of-flight measurement circuit 286 is an example circuit that may be implemented in system 200 (FIG. 2) or system 400 (FIG. 4) to implement any of the TOF distance measurement circuits. TOF measurement circuit 286 includes photodetector (PD) 1280, comparator 1284, integrator 1230, and analog-to-digital converter (A/D) 1240.

The light pulse created by light source 266 is reflected off scanning mirror 216 (FIG. 2) and is then reflected off an object in the field of view. The reflected pulse is sensed at photodetector (PD) 1280, and the amplitude of the reflected pulse is compared to a threshold by comparator 1284. Photodetector 1280 may be any suitable light sensitive device. For example, in some embodiments, PD 1280 may be a silicon PIN photodiode, an avalanche photodiode, or a silicon photomultiplier.

Integrator 1230 receives the pulse timing 243 corresponding to the timing of the emission of a laser light pulse having wavelength $\lambda 1$. Integrator 1230 starts an integration period when a light pulse is emitted, and the integration period is stopped when the amplitude of the reflected pulse exceeds the threshold as determined by comparator 1284. Analog-to-digital converter (A/D) 1240 receives the output of integrator 1230 and produces a digital signal that corresponds to the time-of-flight (TOF) of the laser pulse, which in turn corresponds to the distance (Z) between TOF measurement circuit 286 and the target surface.

The rate at which pulses are created, reflected, and processed in the receive signal path may determine the horizontal spatial measurement resolution on raster pattern 226 (FIG. 2). For example, if pulses are created far apart in time, then measured points on raster pattern 226 may be further apart, and the horizontal spatial resolution will decrease. Also for example, if pulses are created closer in time, then the horizontal spatial resolution can increase. In some embodiments, horizontal spatial resolution is increased by spatial interleaving pulses of different wavelengths.

When uncorrected, laser light source misalignments cause each laser light source to project pulses in different projection regions that have offsets relative to each other making it difficult or impossible to achieve the desired spatial relationship between light pulses of different wavelengths. The various embodiments of the present invention measure the misalignments, generate calibration constants, and modify the pulse generation timing to reduce the offsets between the various projection regions resulting in the projection regions having a defined spatial relationship. The defined spatial relationship may include spatial interleaving of light pulses having different wavelengths, collocation of light pulses having different wavelengths, or a defined offset of pulses having different wavelengths.

Figure 11:
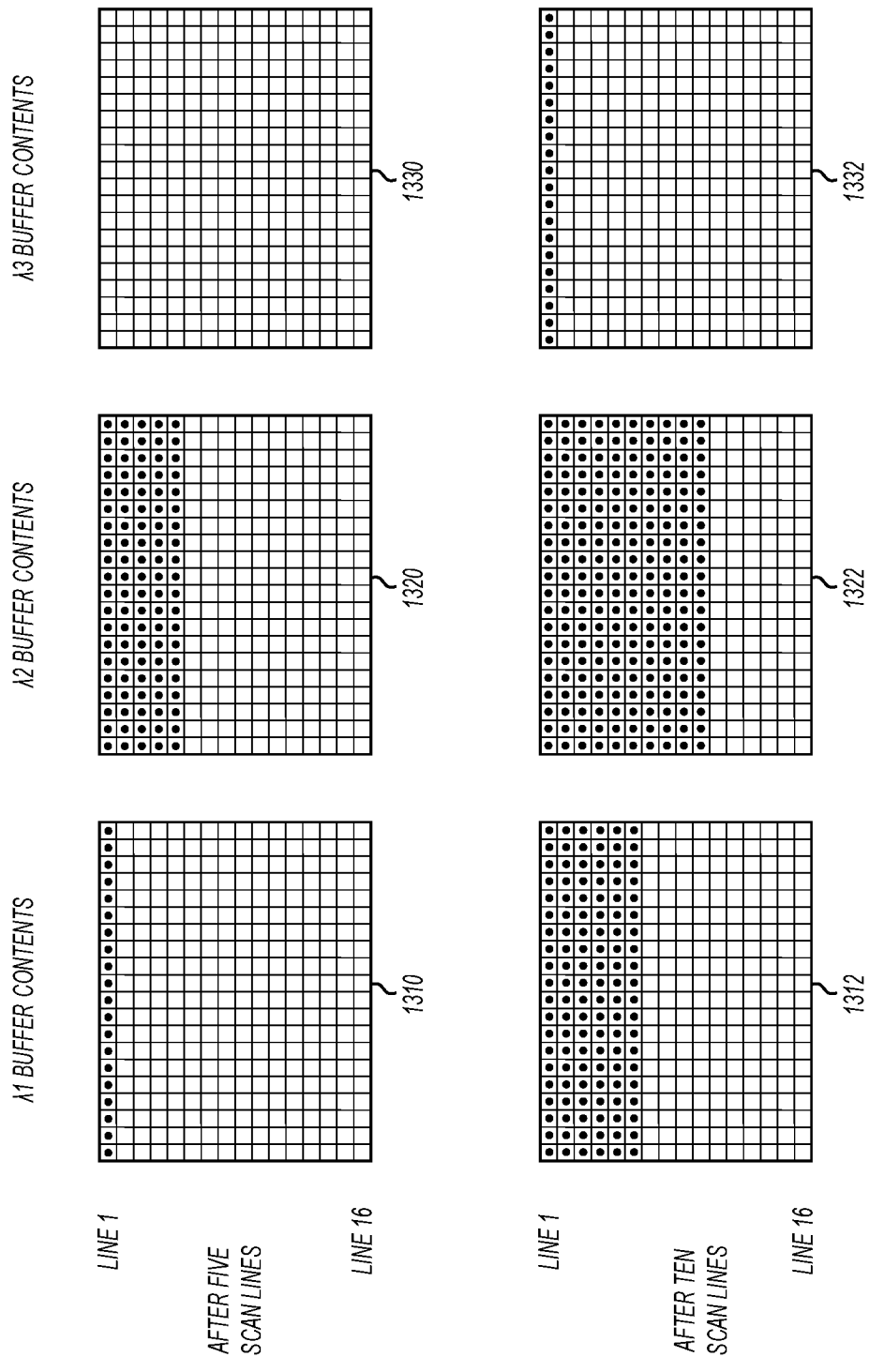
FIG. 11 shows the contents of line buffers during operation in accordance with various embodiments of the present invention.

FIG. 11 shows the contents of line buffers during operation in accordance with various embodiments of the present invention. In response to the laser light source timing adjustments as a function of calibration constants as previously described, the multiple laser light sources project closely aligned dot arrays onto a target scan region. However, after applying timing corrections to align the projection regions of the different laser light sources, the streams of TOF measurements acquired with adjusted timing of laser light sources (three different wavelengths in this example: $\lambda 1$, $\lambda 2$, and $\lambda 3$) have positions in the data stream that are not aligned with the scanned physical position. It may take multiple line passes of the mirror to build up a complete set of sample points for a particular physical scan position.

As shown in FIG. 11, memory buffers are designated for samples from each laser light source, with each line in the buffer corresponding to a scan line. Continuing with the example of FIGS. 7 and 8, the laser light source that emits pulses having a wavelength of $\lambda 2$ begins scanning, its TOF samples are acquired, and its acquisition buffer is populated before either of the other laser light sources. Five scan line periods after the start of scan, the $\lambda 1$ buffer contains one scan line of TOF measurement data, the $\lambda 2$ buffer contains five scan lines of TOF measurement data, and the $\lambda 3$ buffer has not yet reached its active scan region and has thus acquired no data. This is shown at 1310, 1320, and 1330. Five scan line periods later, the $\lambda 1$ buffer contains six scan lines of TOF measurement data, the $\lambda 2$ buffer contains ten scan lines of TOF measurement data, and the λ3 buffer contains one scan line of TOF measurement data. This is shown at 1312, 1322, and 1332.

At this point, all data samples associated with physical target region scan line 1 have been acquired. The post processing circuit may now rearrange this data in its proper sequence on a line basis or point basis, or continue to collect samples until a scan frame (set of multiple scan lines) is completed. Arrangement of the data in proper spatial sequence offers an opportunity for efficient array-oriented buffering and data processing at later stages in the sensing system.

Figure 12:
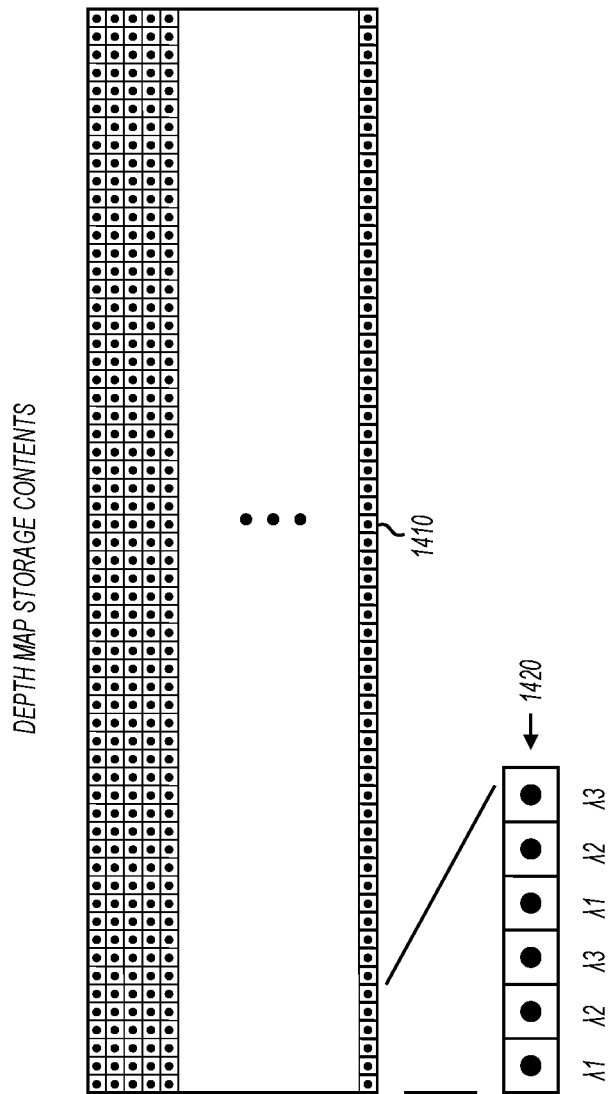
FIG. 12 shows the contents of depth map storage after post processing.

FIG. 12 shows the contents of depth map storage after post processing. A line in correct spatial sequence is constructed by arranging the data from the multiple buffers into a composite line buffer format 1410 within depth map storage 296. Continuing with the example of three laser light sources with spatially interleaved target points, the buffered data is arranged to represent a full high-resolution line with the data in the originally intended scan position. This is represented at 1420, where the first six TOF measurements in the last line are interleaved TOF measurements of wavelengths λ1, λ2, and λ3.

Advantages of data alignment in an array format include efficiency of data processing and storage. An array of depth data in correct spatial sequence does not need coordinates assigned to each sample; the coordinates (other than depth) are implied by the position of the data within the array. Processing functions such as spatial filtering, temporal filtering, motion detection, object identification, and position tracking may be more efficiently processed on an array basis.

This post processing may happen at any stage of operation that is convenient for the buffering and processing pipeline of the system. For example, in some embodiments it is performed line-by-line once each buffer has at least one line of TOF measurement data. In other embodiments, it is performed on a set of lines, or on a frame-by-frame basis. Various embodiments of the present invention neither require nor preclude data storage or processing in a "point cloud format" at a later stage within the system or outside of the system. As used herein, the term "point cloud format" refers to the storing of a three tuple (X,Y,Z) that represents both the X,Y position in the field of view as well as the TOF measurement (Z).

Figure 13:
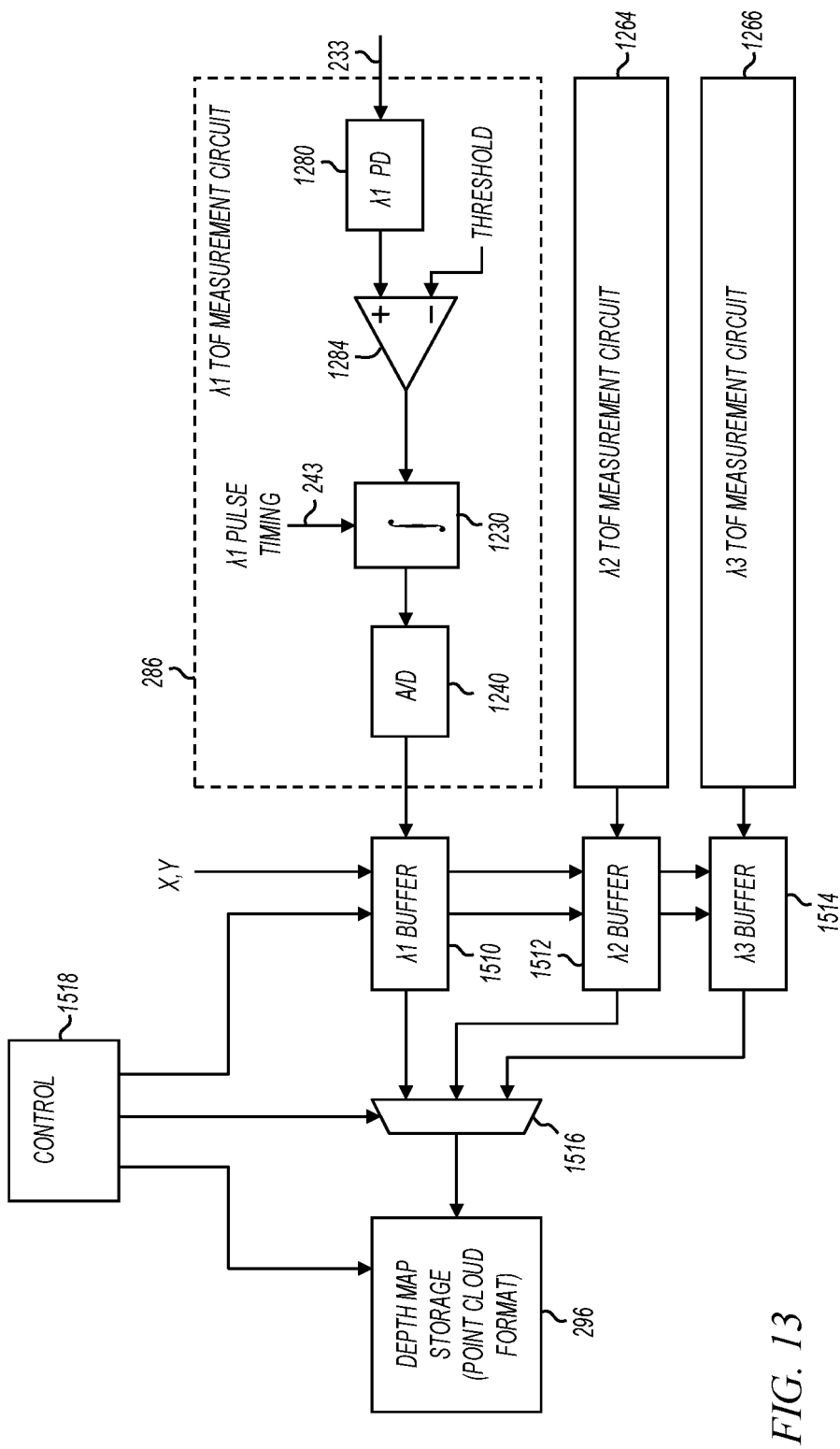
FIGS. 13 and 14 show time of flight distance measurement circuits with post processing circuits in accordance with various embodiments of the present invention.
Figure 14:
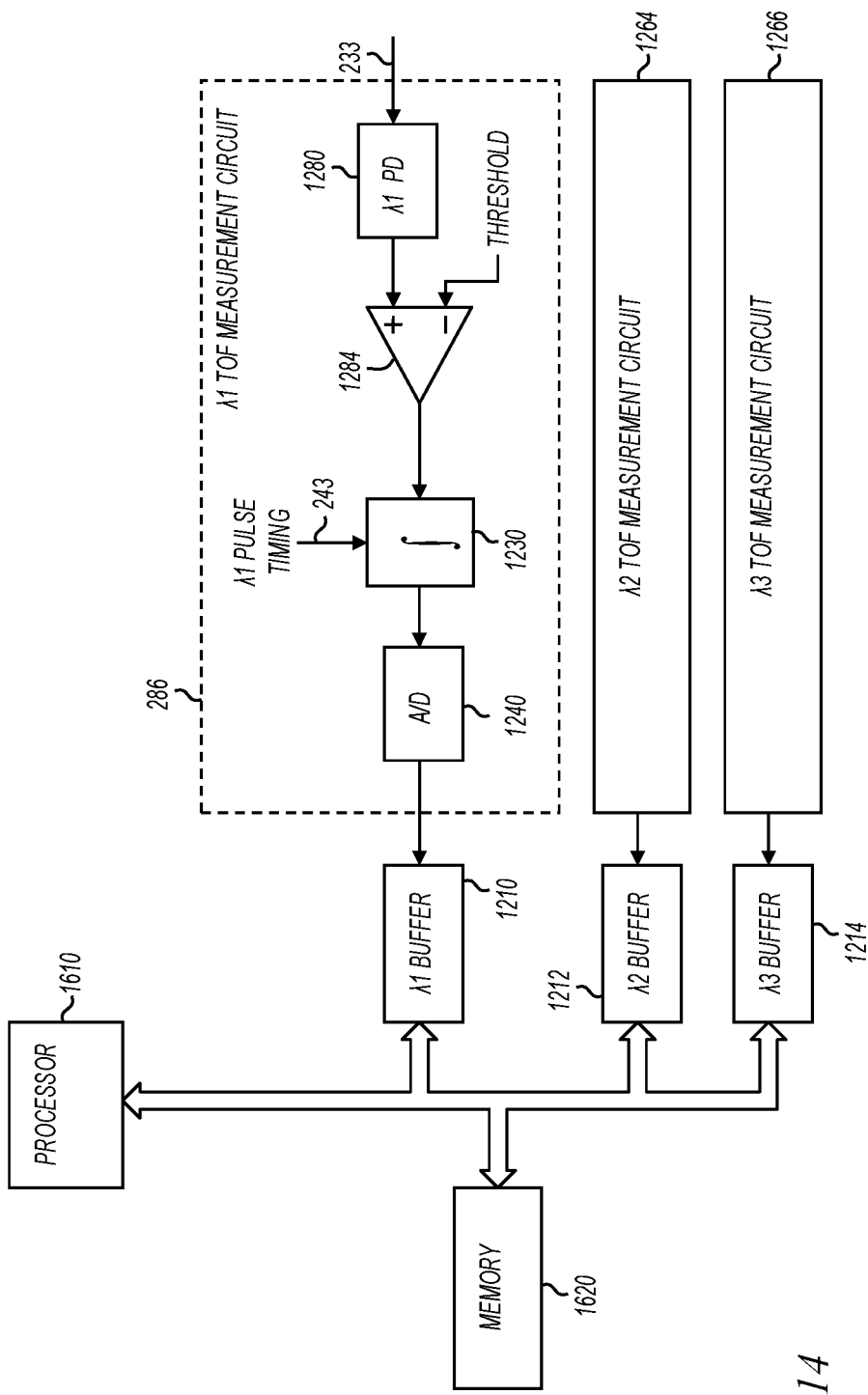

FIGS. 13 and 14 show time of flight distance measurement circuits with post processing circuits in accordance with various embodiments of the present invention. The elements shown in FIG. 13 are similar to the elements shown in FIG. 10 with the exception that the buffers receive X,Y information in addition to TOF measurement data. For example, buffer 1510 receives X,Y information as well as TOF measurement data from TOF measurement circuit 286, buffer 1512 receives X,Y information as well as TOF measurement data from TOF measurement circuit 1264, and buffer 1514 receives X,Y information as well as TOF measurement data from TOF measurement circuit 1266. Accordingly, 3D coordinates (physical depth scan position) are collected for each sample when it is acquired, and the full set of coordinates are stored with each sample in a point cloud format. The samples can then be processed in any sequence. Storing full sets of 3D coordinates may reduce or eliminate the need for post processing, but may be a less efficient format for data storage and further processing, when compared to the sample array sequence storage format described earlier.

Control circuit 1518 and multiplexer 1516 form post processing circuits that combine the TOF measurements from the buffers into an array within depth map storage 296. Buffers 1510, 1512, and 1514 may be populated out of order in time because of laser light source offsets, and the post processing re-orders the TOF measurements within depth map storage 296 to simplify later depth map processing. In some embodiments, the post processing does not re-order the buffer data, but rather simply combines it in depth map storage 296.

In operation, control circuit 1518 may combine TOF data from buffers 1510, 1512, and 1514 after each buffer has at least one scan line worth of TOF data, or may combine the data after a complete frame of TOF data is collected. Control circuit 1518 may include any suitable circuit elements. For example, control circuit 1518 may include a processor, a dedicated state machine, counters, adders, multipliers, or the like.

The elements shown in FIG. 14 are similar to the elements shown in FIG. 10 with the exception that the post processing circuits include processor 1610 and memory 1620. In operation, processor 1610 reads measurement data from buffers 1210, 1212, and 1214 and populates memory 1620 with post processed depth map data. In some embodiments, the post processed depth map data is stored in array format, and in other embodiments, the post processed data is stored in point cloud format.

Processor 1610 may be any type of processor capable of communicating with the various components shown in FIG. 14. For example, processor 1610 may be an embedded processor available from application specific integrated circuit (ASIC) vendors, or may be a commercially available microprocessor. Memory 1620 may be any type of data storage device capable of communicating with the various components shown in FIG. 14. For example, memory 1620 may be a static random access memory device. Further, memory 1620 may be a non-transitory storage medium having encoded instructions, that when accessed by processor 1610, allow processor 1610 to perform the post processing as described.

Figure 15:
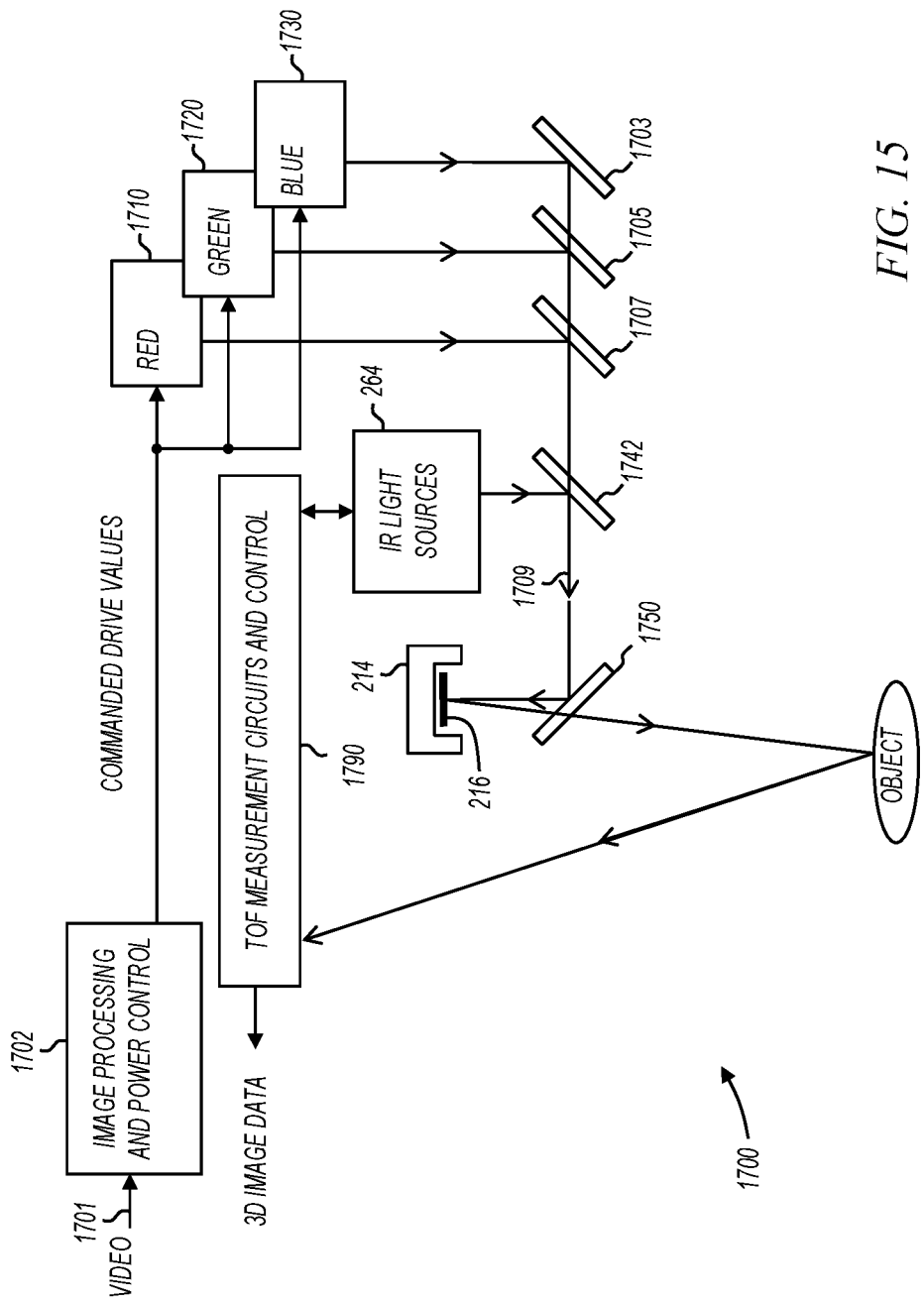
FIG. 15 shows a 3D imaging device in accordance with various embodiments of the present invention.

FIG. 15 shows a 3D imaging device in accordance with various embodiments of the present invention. 3D imaging device 1700 combines a projector with 3D imaging capabilities. The system receives and displays video content in red, green, and blue, and uses infrared light for 3D imaging.

3D imaging device 1700 includes image processing component 1702, TOF measurement circuits and control component 1790, red laser module 1710, green laser module 1720, blue laser module 1730, and infrared laser light sources 264. Light from the laser modules is combined using mirrors 1703, 1705, 1707, and 1742. 3D imaging device 1700 also includes fold mirror 1750, and scanning platform 214 with scanning mirror 216.

In operation, image processing component 1702 processes video content at 1701 and maps image pixels to commanded drive values for each of the red, green, and blue laser sources such that the output intensity from the lasers is consistent with the input image content. In some embodiments, this process occurs at output pixel speeds in excess of 150 MHz.

The laser beams are then directed onto an ultra-high speed gimbal mounted 2 dimensional bi-axial laser scanning mirror 216. In some embodiments, this bi-axial scanning mirror is fabricated from silicon using MEMS processes. The vertical axis of rotation is operated quasi-statically and creates a vertical sawtooth raster trajectory. The horizontal axis is operated on a resonant vibrational mode of the scanning mirror. In some embodiments, the MEMS device uses electromagnetic actuation, achieved using a miniature assembly containing the MEMS die, small subassemblies of permanent magnets and an electrical interface, although the various embodiments are not limited in this respect. For example, some embodiments employ electrostatic or piezoelectric actuation. Any type of mirror actuation may be employed without departing from the scope of the present invention.

Embodiments represented by FIG. 15 combine the video projection described in the previous paragraph with IR laser light sources 264, and TOF measurement circuits and control component 1790 for 3D imaging of the projection surface. TOF measurement circuits and control component 1790 includes components described above with reference to previous figures to detect and measure times of flight of laser light pulses of different wavelengths using a plurality of TOF measurement circuits. For example, in some embodiments, TOF measurement circuits and control component 1790 includes mirror drive and control component 254, drive circuit 240, and TOF measurement circuits 284. TOF measurement circuits and control component 1790 may also include buffering and post-processing circuits as described above.

The 3D imaging apparatus may be used to project video content while at the same time invisibly probing the environment using IR light pulses to create a 3D image of the field of view. These images can be downloaded at kHz rates. Processing of these images provides ultra-high speed 3D depth information. For example, the entire field of view may be surveyed in 3D within a single video frame, which in some embodiments may be within 1/60th of a second. In this way a very high speed 3D camera results that exceeds the speed of currently available 3D imaging devices by an order of magnitude.

Figure 16:
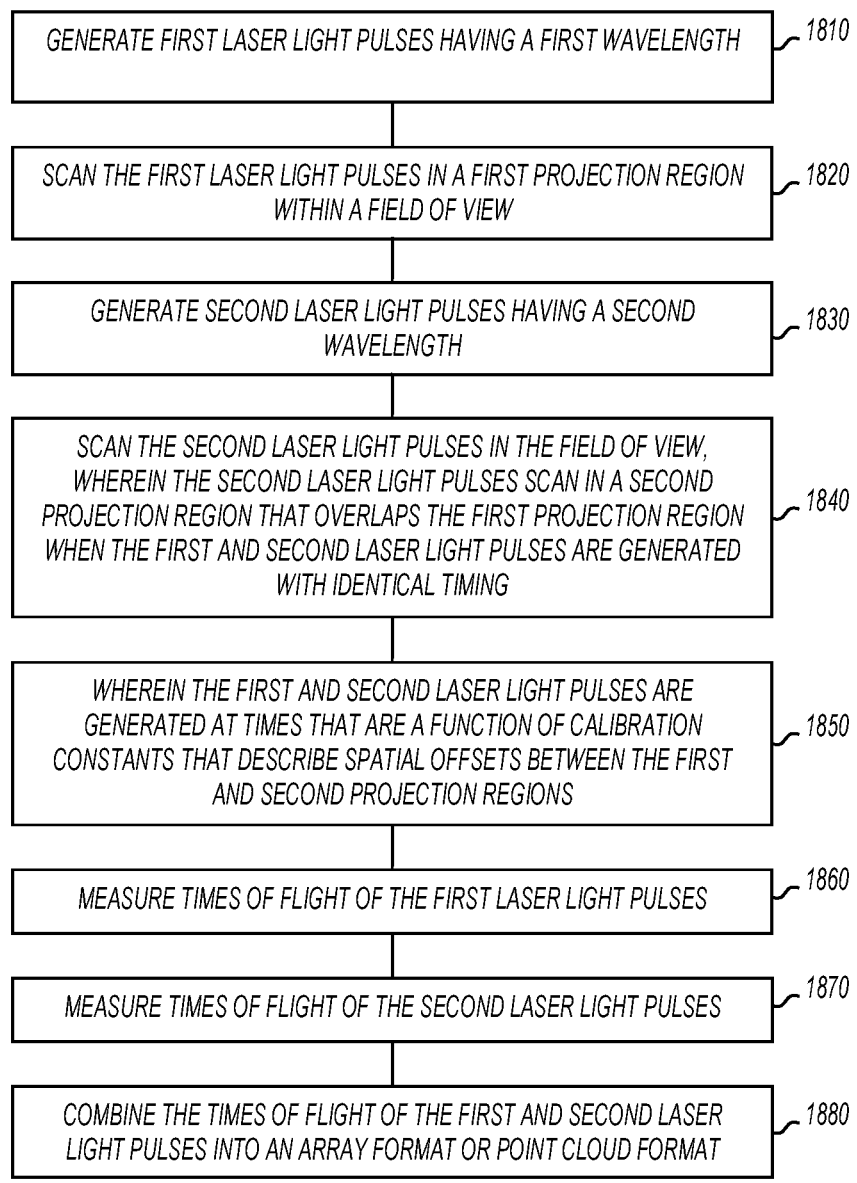
FIG. 16 shows a flow diagram of methods in accordance with various embodiments of the present invention.

FIG. 16 shows a flow diagram of methods in accordance with various embodiments of the present invention. In some embodiments, method 1800, or portions thereof, is performed by a 3D imaging system, embodiments of which are shown in previous figures. In other embodiments, method 1800 is performed by a series of circuits or an electronic system. Method 1800 is not limited by the particular type of apparatus performing the method. The various actions in method 1800 may be performed in the order presented, or may be performed in a different order. Further, in some embodiments, some actions listed in FIG. 16 are omitted from method 1800.

Method 1800 is shown beginning with block 1810. As shown at 1810, first laser light pulses having a first wavelength are generated. In some embodiments, this is performed by a laser light source such as laser light source 266 in response to timing and pulse generation circuits included within driver 240 (FIGS. 2, 9). At 1820, the first laser light pulses are scanned in a first projection region within a field of view. The scanning may be performed by a single mirror or multiple mirrors (FIGS. 2, 4) or a non-mirror scanning mechanism.

At 1830, second laser light pulses having a second wavelength are generated. In some embodiments, this is performed by a laser light source such as laser light source 268 in response to timing and pulse generation circuits included within driver 240 (FIGS. 2, 9). At 1840, the second laser light pulses are scanned in a second projection region that overlaps the first projection region when the first and second laser light pulses are generated with identical timing. This corresponds to the uncorrected projection regions shown in FIG. 5. Misalignment of the laser light sources causes each laser light source to project into a different projection region, where the offset between projection regions is a function the laser light source misalignments.

The first and second laser light pulses are generated at times that are a function of calibration constants that describe spatial offsets between the first and second projection regions that result from laser light source misalignments. In some embodiments, a control circuit advances or delays the generation of laser light pulses as a function of the calibration constants as shown in FIGS. 6 and 8 so that the first and second projection regions will have a defined spatial relationship. The defined spatial relationship may result in spatially interleaved pulses of different wavelengths, collocated pulses of different wavelengths, or any other spatial relationship.

At 1860 and 1870, times-of-flight of the first and second laser light pulses are measured. This corresponds to the operation of the various TOF measurement circuits described above. In some embodiments, the measured times-of-flight are stored in separate buffers until at least one line of TOF data has been collected for each wavelength of light. At 1880, the measured times-of-flight are combined into an array format or a point cloud format. This may be performed by any of the post processing circuits described above.

Figure 17:
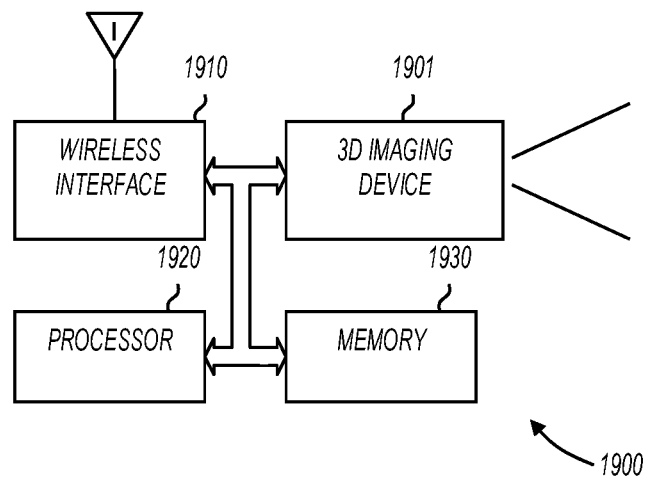
FIG. 17 shows a block diagram of a mobile device in accordance with various embodiments of the present invention.

FIG. 17 shows a block diagram of a mobile device in accordance with various embodiments of the present invention. As shown in FIG. 17, mobile device 1900 includes wireless interface 1910, processor 1920, memory 1930, and 3D imaging device 1901. 3D imaging device 1901 creates a 3D image by measuring the TOF of laser pulses as described above. 3D imaging device 1901 may include laser light sources to produce laser pulses with different wavelengths, and TOF measurement circuits to measure the TOF of pulses of different wavelengths as described herein. For example, 3D imaging device 1901 may include any of apparatus 200 (FIG. 2) or apparatus 400 (FIG. 4).

In some embodiments, 3D imaging device 1901 also includes a scanning projector. For example, 3D imaging device 1901 may include 3D imaging device 1700 (FIG. 15). In these embodiments, 3D imaging device 1901 may receive image data from any image source. For example, in some embodiments, 3D imaging device 1901 includes memory that holds still images. In other embodiments, 3D imaging device 1901 includes memory that includes video images. In still further embodiments, 3D imaging device 1901 displays imagery received from external sources such as connectors, wireless interface 1910, a wired interface, or the like.

Wireless interface 1910 may include any wireless transmission and/or reception capabilities. For example, in some embodiments, wireless interface 1910 includes a network interface card (NIC) capable of communicating over a wireless network. Also for example, in some embodiments, wireless interface 1910 may include cellular telephone capabilities. In still further embodiments, wireless interface 1910 may include a global positioning system (GPS) receiver. One skilled in the art will understand that wireless interface 1910 may include any type of wireless communications capability without departing from the scope of the present invention.

Processor 1920 may be any type of processor capable of communicating with the various components in mobile device 1900. For example, processor 1920 may be an embedded processor available from application specific integrated circuit (ASIC) vendors, or may be a commercially available microprocessor. In some embodiments, processor 1920 provides image or video data to 3D imaging device 1901. The image or video data may be retrieved from wireless interface 1910 or may be derived from data retrieved from wireless interface 1910. For example, through processor 1920, 3D imaging device 1901 may display images or video received directly from wireless interface 1910. Also for example, processor 1920 may provide overlays to add to images and/or video received from wireless interface 1910, or may alter stored imagery based on data received from wireless interface 1910 (e.g., modifying a map display in GPS embodiments in which wireless interface 1910 provides location coordinates).

Figure 18:
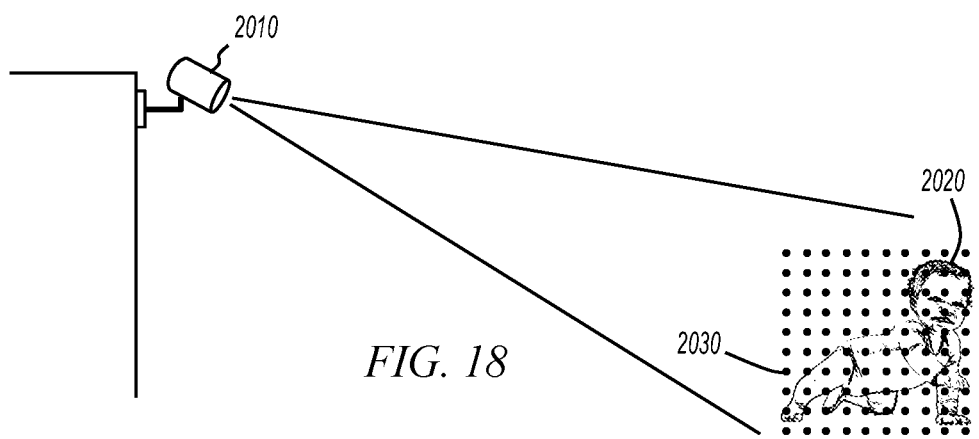
FIG. 18 shows a security camera that includes a scanning 3D imaging system.

FIG. 18 shows a security camera 2010 that includes a scanning 3D imaging system. In some embodiments, security camera 2010 may detect and classify objects detected in a field of view using an array of TOF detection points 2030. For example, in a residential security application, security camera 2010 may detect an object and then classify the object as either human or nonhuman.

Figure 19:
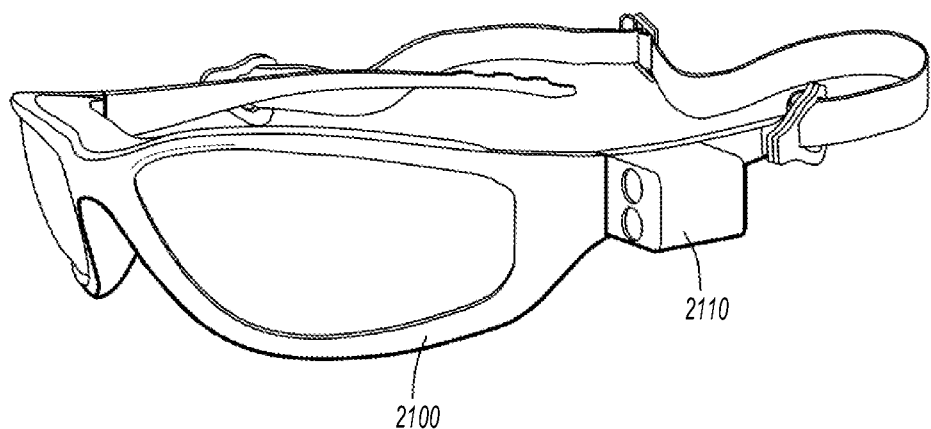
FIG. 19 shows a wearable 3D imaging system in accordance with various embodiments of the invention.

FIG. 19 shows a wearable 3D imaging system in accordance with various embodiments of the invention. In the example of FIG. 19, the wearable 3D imaging system 2100 is in the form of eyeglasses, but this is not a limitation of the present invention. For example, the wearable 3D imaging system may be a hat, headgear, worn on the arm or wrist, or be incorporated in clothing. The wearable 3D imaging system 2100 may take any form without departing from the scope of the present invention.

Wearable 3D imaging system 2100 includes 3D imaging device 2110. 3D imaging device 2110 creates a 3D image by measuring the TOF of laser pulses as described above. 3D imaging device 2110 may include a plurality of light sources and TOF measurement circuits for processing spatially interleaved laser pulses of different wavelengths as described herein. For example, 3D imaging device 2110 may include any of apparatus 200 (FIG. 2), or apparatus 400 (FIG. 4). In some embodiments, 3D imaging device 2110 also includes a scanning projector. For example, 3D imaging device 2110 may include 3D imaging device 1700 (FIG. 15).

In some embodiments, wearable 3D imaging system 2100 provides feedback to the user that is wearing the system. For example, a head up display may be incorporated to overlay 3D images with data to create a virtual reality, an augmented reality. Further, tactile feedback may be incorporated in the wearable 3D imaging device to provide interaction with the user.

Figure 20:
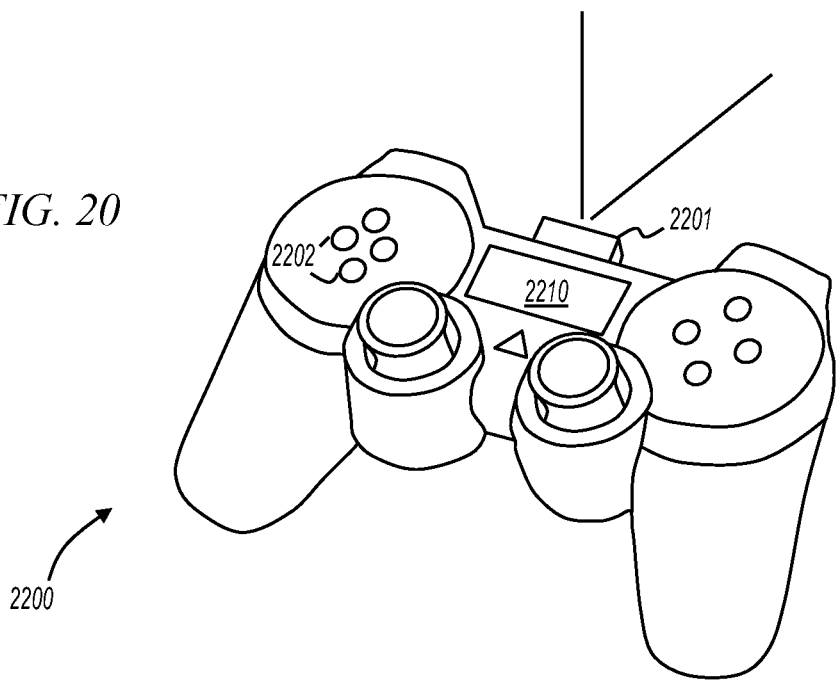
FIG. 20 shows a gaming apparatus in accordance with various embodiments of the present invention.

FIG. 20 shows a gaming apparatus in accordance with various embodiments of the present invention. Gaming apparatus 2200 includes buttons 2202, display 2210, and 3D imaging device 1901. In some embodiments, gaming apparatus 2200 is a standalone apparatus that does not need a larger console for a user to play a game. For example, a user may play a game while watching content displayed by 3D imaging device 1901 and/or display 2210. In other embodiments, gaming apparatus 2200 operates as a controller for a larger gaming console. In these embodiments, a user may watch a larger screen tethered to the console in combination with watching display 2210 and/or content projected by 3D imaging device 1901.

3D imaging devices described herein have many additional applications. For example, various embodiments of the present invention may be included in automobiles for the purposes of occupancy detection, sleep/gaze detection, gesture detection, interaction, communication, and the like. Also for example, various embodiments of the present invention may be included in cameras and security or surveillance devices such as home security devices, smart cameras, IP cameras, and the like.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. An apparatus comprising:
   a first laser light source to emit first laser light pulses for first scan frames;
   a second laser light source to emit second laser light pulses for second scan frames;
   at least one scanning mirror to reflect and scan the first laser light pulses into multiple first scan lines for each of the first scan frames and scan the second laser light pulses into multiple second scan lines for each of the second scan frames, where the multiple first scan lines are scanned into a first projection region and the multiple second scan lines are scanned into a second projection region having a spatial offset from the first projection region when the first and second laser light pulses are produced with identical timing;
   a driver circuit to generate pulses to drive the first laser light source to emit each of the first laser light pulses for the first scan frames at shifted times relative to each of the second laser light pulses for the second scan frames emitted by the second laser light source to reduce the spatial offset between the first and second projection regions;
   a first time-of-flight measurement circuit to receive reflections of, and to determine times-of-flight of, the first laser light pulses; and
   a second time-of-flight measurement circuit to receive reflections of, and to determine times-of-flight of, the second laser light pulses.

2. The apparatus of claim 1 wherein:
   the driver circuit is configured to be responsive to at least one calibration constant that describes the spatial offset between the first and second projection regions to generate the pulses to drive the first laser light source to emit the first laser light pulses at shifted times relative to the second laser light pulses emitted by the second laser light source.

3. The apparatus of claim 2 further comprising a third laser light source to emit third laser light pulses that are scanned into a third projection region that overlaps the first projection region when the first and third laser light pulses are produced with identical timing, wherein the driver circuit is further configured to be responsive to at least one second calibration constant that describes a spatial offset between the first and third projection regions to generate pulses to drive the third laser light source to emit the third laser light pulses at shifted times relative to the first laser light pulses.

4. The apparatus of claim 2 wherein the at least one calibration constant comprises a first calibration constant that describes a horizontal offset between the first and second projection regions, and a second calibration constant that describes a vertical offset between the first and second projection regions.

5. The apparatus of claim 1 further comprising:
   a first buffer to receive time-of-flight measurements from the first time-of-flight measurement circuit, and
   a second buffer to receive time-of-flight measurements from the second time-of-flight measurement circuit.

6. The apparatus of claim 5 further comprising a post-processing circuit to combine time-of-flight measurements from the first and second buffers into an array, wherein an array index corresponds to a spatial location of each time-of-flight measurement.

7. The apparatus of claim 1 wherein the first laser light pulses have a first wavelength and the second laser light pulses have a second wavelength.

8. The apparatus of claim 7 wherein the first and second wavelengths are infrared wavelengths.

9. The apparatus of claim 8 further comprising:
at least one laser light source to produce laser light pulses in the visible spectrum; and
image processing circuitry to modulate the at least one visible laser light source to display an image while measuring distance at multiple points in a field of view.

10. A 3D imaging device comprising:
a scanning mirror to scan first infrared laser light pulses having a first wavelength for first scan frames into multiple first scan lines in a first projection region and second infrared laser light pulses having a second wavelength for second scan frames into multiple second scan lines in a second projection region;
a first time of flight distance measurement circuit to determine distances traveled by reflected infrared laser light pulses having the first wavelength;
a second time of flight distance measurement circuit to determine distances traveled by reflected infrared laser light pulses having the second wavelength; and
a driver circuit to determine timings of the first and second infrared laser light pulses, the driver circuit configured to shift the timings of each of the first infrared laser light pulses for the first scan frames relative to each of the second infrared laser light pulses for the second scan frames to modify a location of the second projection region resulting in the first and second projection regions having a defined spatial relationship.

11. The 3D imaging device of claim 10 wherein the driver circuit determines timings of the first and second infrared laser light pulses such that the first and second infrared laser light pulses are interleaved in space.

12. The 3D imaging device of claim 10 wherein the driver circuit is responsive to at least one calibration constant that describes a spatial offset between the first and second projection regions to shift the timings of the first infrared laser light pulses relative to the second infrared laser light pulses.

13. The 3D imaging device of claim 10 wherein the scanning mirror comprises a single biaxial scanning mirror.

14. The 3D imaging device of claim 10 wherein the scanning mirror comprises a first mirror to scan in a first dimension and a second mirror to scan in a second dimension.

15. The 3D imaging device of claim 10 further comprising:
a first buffer to receive time-of-flight measurements from the first time of flight distance measurement circuit,
a second buffer to receive time-of-flight measurements from the second time of flight distance measurement circuit; and
a post-processing circuit to combine time-of-flight measurements from the first and second buffers into an array, wherein an array index corresponds to a spatial location of each time-of-flight measurement.

16. A method comprising:
generating first laser light pulses of a first wavelength for first scan frames;
scanning the first laser light pulses into multiple first scan lines for the first scan frames in a first projection region within a field of view;
generating second laser light pulses of a second wavelength for second scan frames; and
scanning the second laser light pulses into multiple second scan lines for the second scan frames in the field of view, wherein the second laser light pulses scan in a second projection region that overlaps the first projection region when the first and second laser light pulses are generated with identical timing; and
wherein generating first and second laser light pulses comprises generating each of the first laser light pulses for the first scan frames at shifted times relative to each of the second laser light pulses for the second scan frames, where the shifted times of the first laser light pulses are a function of calibration constants that describe spatial offsets between the first and second projection regions.

17. The method of claim 16 further comprising:
generating third laser light pulses of a third wavelength; and
scanning the third laser light pulses in a third projection region within the field of view, wherein the third projection region overlaps the first projection region when the first and third laser light pulses are generated with identical timing, and wherein generating the third laser light pulses comprises generating laser light pulses at shifted times relative to the first laser light pulses, where the shifted times of the third laser light pulses are a function of calibration constants that describe spatial offsets between the first and third projection regions.

18. The method of claim 16 further comprising:
measuring times of flight of the first laser light pulses; and
measuring times of flight of the second laser light pulses.

19. The method of claim 18 further comprising combining the times of flight of the first and second laser light pulses into an array wherein an array index corresponds to a spatial location of each time-of-flight measurement.

20. The method of claim 18 further comprising combining the times of flight of the first and second laser light pulses with data describing the location of each time of flight measurement.

* * * * *